United States Patent
Chu et al.

(10) Patent No.: US 10,125,285 B2
(45) Date of Patent: Nov. 13, 2018

(54) METHOD OF PRINTING ULTRANARROW-GAP LINES

(71) Applicant: National Research Council of Canada, Ottawa (CA)

(72) Inventors: Ta-Ya Chu, Ottawa (CA); Christophe Py, Ottawa (CA); Ye Tao, Ottawa (CA); Zhiyi Zhang, Ottawa (CA); Afshin Dadvand, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 15/740,550

(22) PCT Filed: Jun. 30, 2016

(86) PCT No.: PCT/CA2016/050768
§ 371 (c)(1),
(2) Date: Dec. 28, 2017

(87) PCT Pub. No.: WO2017/004703
PCT Pub. Date: Jan. 12, 2017

(65) Prior Publication Data
US 2018/0187036 A1    Jul. 5, 2018

Related U.S. Application Data

(60) Provisional application No. 62/188,563, filed on Jul. 3, 2015.

(51) Int. Cl.
*B05D 5/00*    (2006.01)
*C09D 11/52*    (2014.01)
(Continued)

(52) U.S. Cl.
CPC ............ *C09D 11/52* (2013.01); *H01L 29/772* (2013.01); *H01L 51/0022* (2013.01);
(Continued)

(58) Field of Classification Search
None
See application file for complete search history.

(56) References Cited

U.S. PATENT DOCUMENTS 5,602,047 A   2/1997  Tsai
5,989,944 A   11/1999 Yoon
(Continued)

FOREIGN PATENT DOCUMENTS

CA    2 593 884 A1    1/2008
EP    0402942         12/1990
(Continued)

OTHER PUBLICATIONS

International Search Report and Written Opinion dated Jan. 12, 2017 for PCT/CA2016/050767 filed Jun. 30, 2016.
(Continued)

*Primary Examiner* — Lisha Jiang
(74) *Attorney, Agent, or Firm* — Wegman, Hessler & Vanderburg (57) ABSTRACT

Disclosed is a method of printing ultranarrow-gap lines of a functional material, such as an electrically conductive silver ink. The method entails providing a substrate having an interlayer coated on the substrate and printing the ultranarrow-gap lines by depositing ink on the interlayer of the substrate, the ink comprising the functional material and a solvent that swells the interlayer to cause the interlayer to bulge at edges of the ink to thereby define embankments that confine the ink.

16 Claims, 14 Drawing Sheets

(51) Int. Cl.
    H01L 29/772    (2006.01)
    H01L 51/00     (2006.01)
    H01L 51/05     (2006.01)
    H01L 51/10     (2006.01)
    H05K 1/16      (2006.01)
(52) U.S. Cl.
    CPC ...... *H01L 51/0023* (2013.01); *H01L 51/0508* (2013.01); *H01L 51/105* (2013.01); *H05K 1/16* (2013.01)

(56) References Cited

U.S. PATENT DOCUMENTS

| | | | |
|---|---|---|---|
| 7,223,700 | B2 | 5/2007 | Wong |
| 7,615,483 | B2 | 11/2009 | Daniel et al. |
| 7,745,101 | B2 | 6/2010 | Tutt et al. |
| 7,745,202 | B2 | 6/2010 | Higa |
| 7,749,396 | B2 | 7/2010 | Chow |
| 8,278,138 | B2 | 10/2012 | Yang |
| 8,465,905 | B2 | 6/2013 | Schuster |
| 2006/0032437 | A1 | 2/2006 | McMacklin et al. |
| 2007/0190673 | A1 | 8/2007 | Ko |
| 2009/0145640 | A1 | 6/2009 | Toyoda |
| 2009/0181172 | A1 | 7/2009 | Parpia et al. |
| 2013/0165549 | A1 | 6/2013 | Wagman et al. |
| 2013/0213817 | A1 | 8/2013 | Lo |

FOREIGN PATENT DOCUMENTS

| | | | |
|---|---|---|---|
| EP | 1933393 | | 6/2008 |
| EP | 1933393 A1 * | | 6/2008 ......... H01L 51/0019 |
| EP | 2 257 969 A2 | | 2/2009 |
| JP | H07273009 | | 10/1995 |
| JP | 2008294391 | | 12/2008 |
| JP | 2013065633 | | 4/2013 |
| JP | 2013065633 A * | | 4/2013 |
| WO | 2006113400 | | 10/2006 |
| WO | 2009108771 | | 9/2009 |
| WO | 2011021763 | | 2/2011 |
| WO | 2014072016 | | 5/2014 |

OTHER PUBLICATIONS

International Search Report and Written Opinion dated Jan. 12, 2017 for PCT/CA2016/050768 filed Jun. 30, 2016.
International Search Report and Written Opinion dated Jan. 12, 2017 for PCT/CA2016/050769 filed Jun. 30, 2016.
International Preliminary Report on Patentability for International Patent Application No. PCT/CA2016/050767 dated Jan. 9, 2018.
International Search Report and Written Opinion dated Sep. 12, 2016 for PCT/CA2016/050767 filed Jun. 30, 2016.
Abbel, et al., "Narrow Conductive Structures with High Aspect Ratios Through Single-Pass Inkjet Printing and Evaporation-Induced Dewetting", Advanced Engineering Materials, DOI: 10.1002/adam.201400339, pp. 1-5, 2014.
Dockendorf, et al., "Size reduction of nanoparticle ink patterns by fluid-assisted dewetting", Applied Physics Letters 88, 2006.
L. Jacot-Descombes, et al., "Fabrication of epoxy spherical microstructures by controlled drop-on-demand inkjet printing", Journal of Micromechanics and Microengineering, pp. 1-9, 2012.
Nguyen, et al., "An approach for controlling printed line-width in high resolution roll-to-roll gravure printing", Journal of Micromechanics and Microengineering, pp. 1-11, 2013.
Soltman, et al., "Inkjet-Printed Line Morphologies and Temperature Control of the Coffee Ring Effect", Langmuir 2008, 24, pp. 2224-2231.
Soltman, et al., "Methodology for Inkjet Printing of Partially Welling Films", Langmuir Article, 2010, pp. 15686-15693.
Van Osch, et al., "Inkjet Printing of Narrow Conductive Tracks on Untreated Polymeric Substrates", Advanced Materials, 2008, pp. 343-345.

International Search Report and Written Opinion dated Sep. 14, 2016 for PCT/CA2016/050768 filed Jun. 30, 2016.
Yokota et al., "Low-voltage organic transistor with subfemtoliter inkjet source-drain contacts", MRS Communications (2011), pp. 3-6.
Yin et al., "Inkjet printing for flexible electronics: Materials, processes and equipments", Chinese Science Bulletin, Oct. 2010, vol. 55, No. 30, pp. 3383-3407.
Tang, et al., "Inkjet Printing Narrow Fine Ag Lines on Surface Modified Polymeric Films", Department of Electronic Engineering, Shanghai Jiao Tong University, China, 2013 IEEE, pp. 1171-1174.
Suzuki et al., "All-printed Organic TFT Backplanes for Flexible Electronic Paper", International Symposium on Electronic Paper, The Imaging Society of Japan, 2010, pp. 1-6.
Sirringhaus et al., "High-Resolution Inkjet Printing of All-Polymer Transistor Circuits", Science, vol. 290, Dec. 15, 2000, pp. 2123-2126.
Sele, et al., "Lithography-Free, Self-Aligned Inkjet Printing with Sub-Hundred-Nanometer Resolution", Advanced Materials, 2006, 17, No. 8, Apr. 2018, pp. 997-1001.
Rogers, et al. "Printing Process Suitable for Reel-to-Reel Production of High-Performance Organic Transistors and Circuits", Advanced Materials, 1999, 11, No. 9, pp. 741-745.
SIJ Technology Inc. Super fine inkjet printer, https://web.archive.org/web/20141204024608/http://www.sijtechnology, (no date available).
Park, et al., "High-resolution electrohydrodynamic jet printing", Nature Publishing Group, 2007, pp. 782-789.
Li, "OTFT Integration Strategies,"pp. 56-100, (no date available).
Kang, et al., "Self-aligned flexible all-polymer transistor: Ultraviolet printing", Applied Physics Letters 93, 2008, pp. 1-3.
Jeong et al., "Self-Defined Short Channel Formation With Micromolded Separator and Inkjet-Printed Source/Drain Electrodes in OTFTs", IEEE Electron Device Letters, vol. 32, No. 12, Dec. 2011, pp. 1758-1760.
Cheng, et al. "Effect of PVP-coated silver nanoparticles using laser direct patterning process by photothermal effect", Microelectronic Engineering 88, 2011, pp. 929-934.
Doggart et al., "Facile Inkjet-Printing Self-Aligned Electrodes for Organic Thin-Film Transistor Arrays with Small and Uniform Channel Length", Applied Materials and Interfaces, 2010, pp. 2189-2192.
Frederix et al., "Biosensing Based on Light Absorption of Nanoscaled Gold and Silver Particles", Analytical Chemistry, vol. 75, No. 24, Dec. 15, 2003, pp. 6894-6900.
Kang et al., "Sintering of Inkjet-Printed Silver Nanoparticles at Room Temperature Using Intense Pulsed Light", Journal of Electronic Materials, vol. 40, No. 11, 2011, pp. 2268-2277.
Kumpulainen et al., "Low temperature nanoparticle sintering with continuous wave and pulse lasers", Optics & Laser Technology, 43, 2011, pp. 570-576.
Lesyuk et al., "Low-energy pulsed laser treatment of silver nanoparticles for interconnects fabrication by ink-jet method", Microelectronic Engineering, 88, 2011, pp. 318-321.
Palfinger et al., "Fabrication of n- and p-Type Organic Thin Film Transistors with Minimized Gate Overlaps by Self-Aligned Nanoimprinting", Advanced Materials, 2010, 22, pp. 5115-5119.
Roy et al., "Self-aligned Inkjet Printing of TFTs/Circuits", IEEE 2012, Microsystems Center, Tyndall National Institute, University College Cork, Lee Maltings, Dyke Parade, Cork, Ireland, pp. 1-4.
Tseng et al., "High-speed organic transistors fabricated using a novel hybrid-printing technique", Organic Electronics 12, 2011, pp. 1120-1125.
Wikipedia—Photonic curing, http://en.wikipedia.org/wiki/Photonic_curing, Oct. 2014, pp. 1-3.
International Preliminary Report on Patentability for International Patent Application No. PCT/CA2016/050769 dated Jan. 9, 2018.
International Search Report and Written Opinion dated Sep. 14, 2016 for PCT/CA2016/050769 filed Jun. 30, 2016.

* cited by examiner

IV characteristics of the all printed OFET

METHOD OF PRINTING ULTRANARROW-GAP LINES

TECHNICAL FIELD

The present disclosure relates generally to fabrication techniques for printable electronic devices and, in particular, to a technique for printing narrow-gap lines in fabricating a printable electronic device.

BACKGROUND

Printing processes as a means for material deposition is an efficient way to increase material usage and to eliminate the photolithography process. One of the major challenges for printing high-resolution patterns is limiting uncontrolled spreading of ink on the substrate. In field-effect transistors, for example, a narrow channel (the gap between source and drain electrodes) is required in order to obtain a sufficient current at a low driving voltage with a high-frequency switching speed. For example, high frequency (HF) Radio-Frequency Identification (RFID) tags operate at a minimum frequency of 13.56 MHz; as a result, a printed HF RFID requires a channel length of 1 to 5 µm. Conventional printing methods can only reliably produce electrodes with a minimum gap of 10 µm to 50 µm, in order to avoid an electrical short between the two electrodes.

Figure 1:
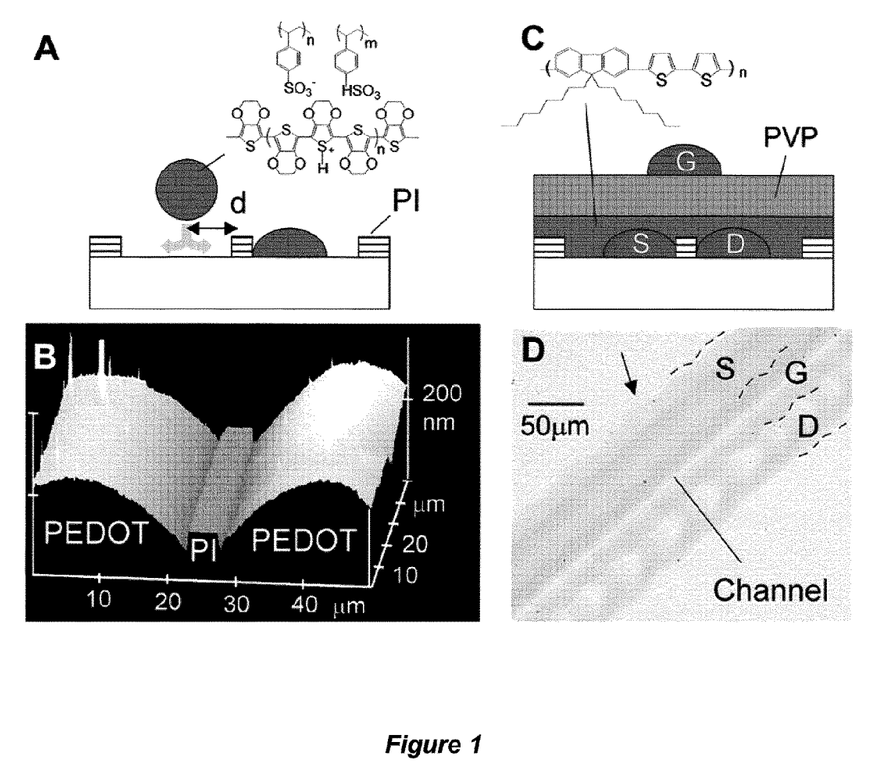
FIG. 1 depicts a photolithography technique using pre-patterned polyimide as ink barrier strips.

Photolithography is a well-established method for the microfabrication of thin film patterns, but it is a relatively high cost and complex method. A combination of photolithography and printing processes has been demonstrated for the fabrication of inkjet-printed organic thin film transistors (OTFTs). Sirringhaus et al. demonstrated a printed channel length of 5 µm obtained using a photolithography pre-patterning process. See Sirringhaus, H., Kawase, T., Friend, R. H., Shimoda, T., Inbasekaran, M., Wu, W., and Woo, E. P. Science 290, 2123 (2000). The gap between two printed electrodes is defined by a patterned polyimide strip, which acts as a barrier between electrodes and thus defines the channel length. FIG. 1 shows a photolithography technique of the prior art.

Figure 2:
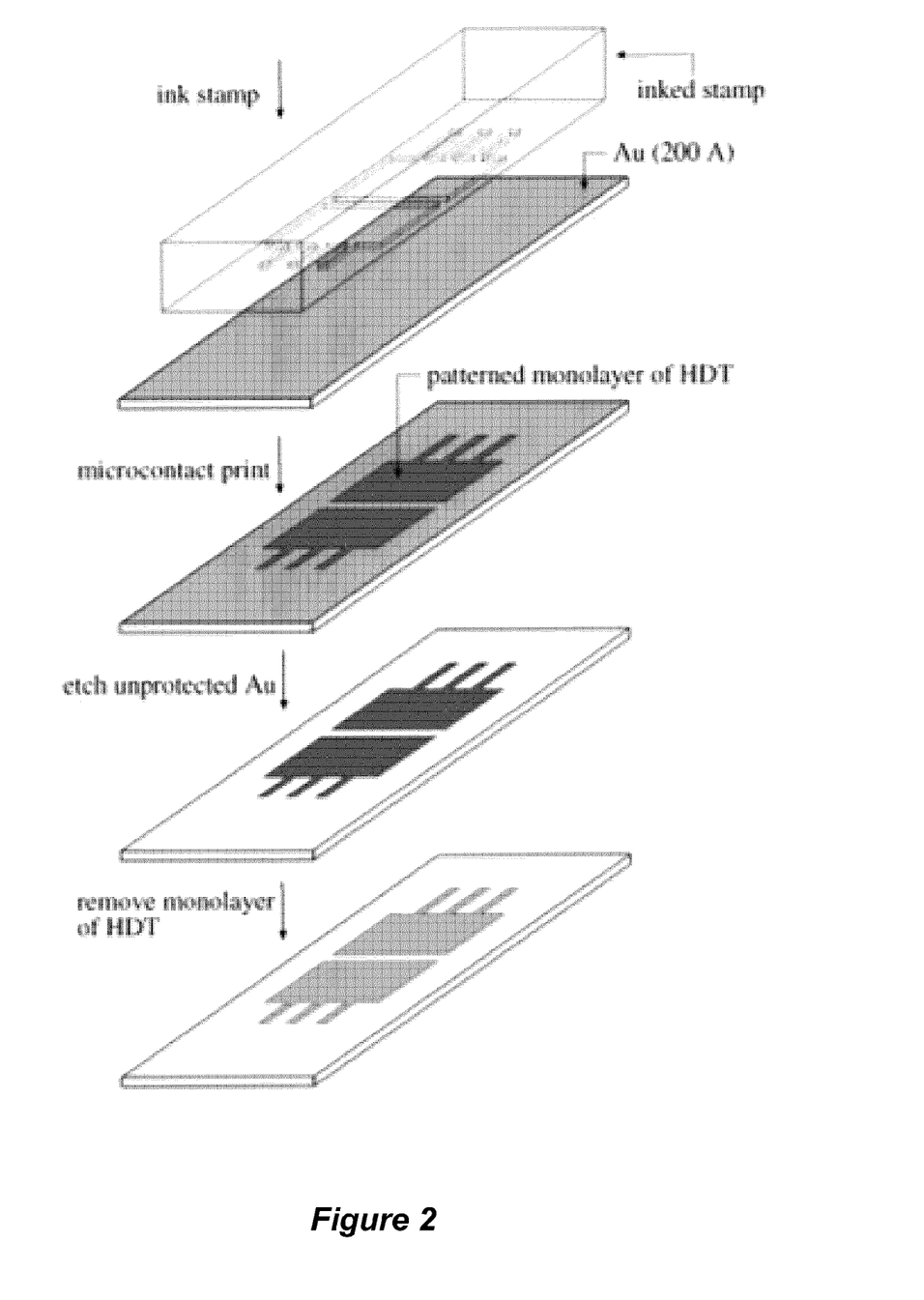
FIG. 2 depicts a process diagram for PDMS microcontact printing.

Microcontact printing, using an elastomeric stamp as shown in FIG. 2, is another method to pre-pattern the ink barrier strips before printing conductive materials. Rogers et al. reported a 2 µm channel length by microcontact printing. See Rogers, J.-A., Bao, Z., Makhija, A., and Braun, P. Adv. Mater. 11, 741 (1999). However, the method is based on soft lithography, which involves the replication of a stamp from a master fabricated by conventional lithography and etching.

Figure 3:
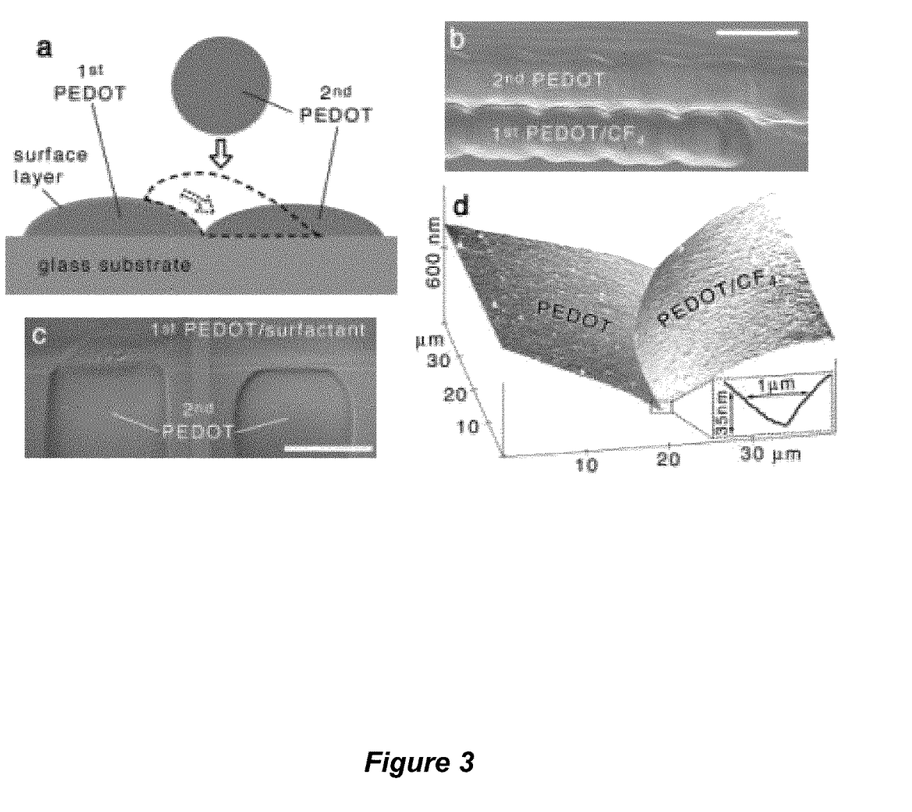
FIG. 3 depicts a drain self-alignment method.

A lithography-free self-aligned method to fabricate drain and source electrodes with a narrow gap was proposed by Sirringhaus et al. in 2005. See Christophe W. Sele, Timothy von Werne, Richard H. Friend, and Henning Sirringhaus, Adv. Mater. 17, 997 (2005). It uses a carbon tetrafluoride ($CF_4$) plasma treatment to form a thin layer of fluorinated layer on the first printed PEDOT:PSS electrode; as a result, a high surface energy contrast exists between the fluorinated PEDOT:PSS and the substrate, and the second printed PEDOT:PSS droplets will flow off to the substrate as shown in FIG. 3.

Figure 4:
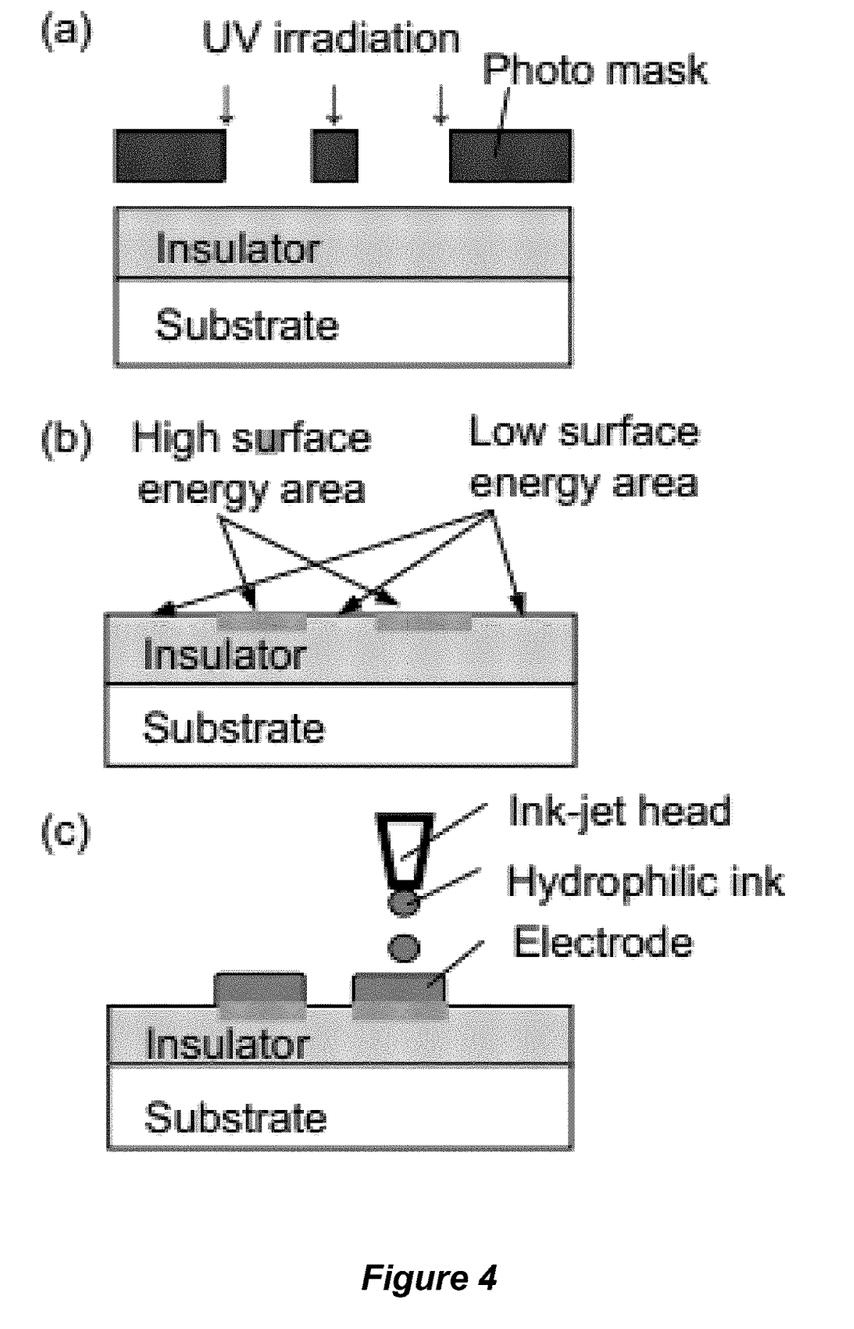
FIG. 4 depicts a technique for surface energy control.

As shown in FIG. 4, a patterning method based on the control of surface energy through a UV irradiation process with a photomask has been demonstrated by K. Suzuki et al. (K. Suzuki, K. Yutani, M. Nakashima, A. Onodera, S. Mizukami, M. Kato, T. Tano, H. Tomono, M. Yanagisawa and K. Kameyama, International Symposium on Electronic Paper 2010; http://www.ricoh.com/about/company/technology/tech/pdf/idw10paper.pdf) and achieved a minimum gap of 2 µm between two electrodes.

Tomoyuki Yokota et al. reported an electrostatic inkjet printing head using 0.5 femtoliter nozzle, which can obtain a printed Ag line width of 1 µm and a channel length of 1 µm. See Tomoyuki Yokota et al. MRS Communications 1, 3-6, 2011 and http://www.sijtechnology.com/en/super_fine_inkjet/index.html.

Rogers also proposed electrohydrodynamic jet printing, in which a drop of a conductive ink is sharpened by an electrostatic field. The method can produce lines down to 1 µm in width. See also Park, J.-U., Hardy, M., Kang, S. J., et al., High-resolution electrohydrodynamic jet printing. Nat Mater. 6(10), 782-789 (2007).

It is believed that commercial printing technologies can only achieve a printed gap around 10 µm using the surface energy engineering technique. See W. Tang, Y. Chen, J. Zhao, S. Chen, L. Feng, X. Guo, IEEE NEMS, p. 1171 (2013).

There are many advantages of using a photolithography process for microfabrication patterning, which include high resolution, speed and parallel patterning capabilities, reproducibility, etc. However, the process complexity and incompatibility between the materials and photoresists, solvents and developers are the main challenges for low-cost printable electronics fabrication on flexible substrates. A straightforward method to reduce cost is to develop a direct, printable microfabrication patterning process to eliminate the photolithography.

The self-alignment method proposed by Sirringhaus achieved a submicrometer channel length without photolithography. However, the fluorination of the first electrode alters its physical properties and those of the resulting device; the variations in gap sizes are too large to produce any useful circuit, as seen in FIG. 3.

The Suzuki method to control surface energy is efficient, but a photomask is still required, which limits the substrate size and flexibility of pattern design, and increases the cost.

The electrostatic print head with femtoliter droplet has very limited printing speed and only a single nozzle can be used to date.

Figure 5:
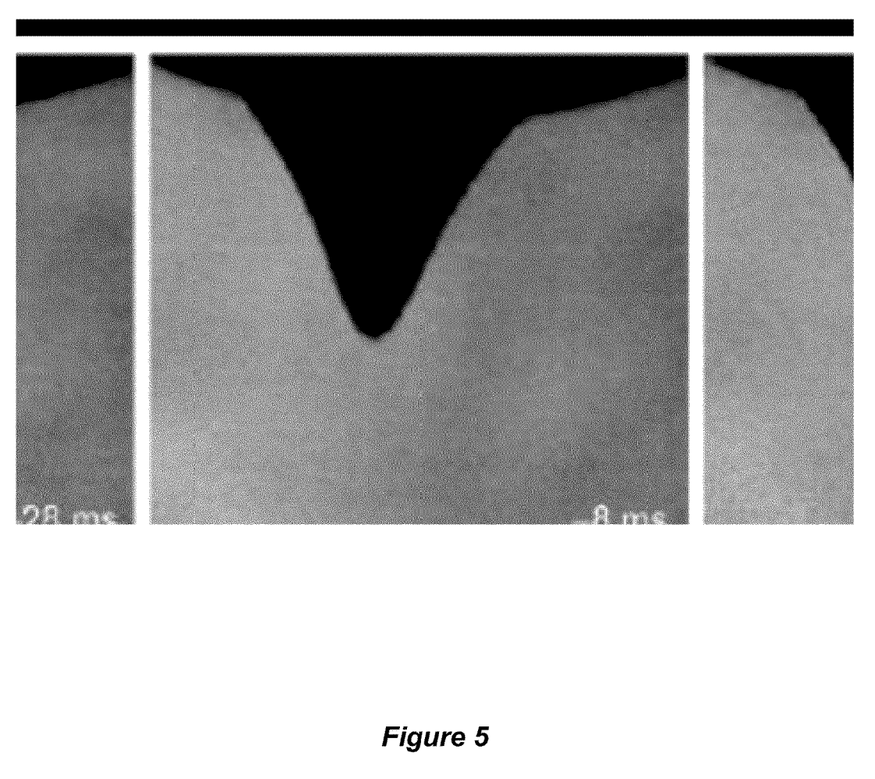
FIG. 5 depicts electrohydrodynamic jet printing.

Electrohydrodynamic jet printing produces the finest lines but the printing is very slow, and charged ink drops may present problems in devices. The electrostatic and electro-hydrodynamic techniques seek to obtain fine patterns by reducing the size of the drop being jetted, as shown in FIG. 5, but do nothing to control its spreading on the substrate.

Accordingly, a new or improved printing technique would be highly desirable in order to facilitate fabrication of printable electronic devices.

SUMMARY

The present disclosure provides a new direct printing process for printing lines with narrow gaps (referred to herein as "ultranarrow" gaps) without requiring any pre-patterning or pre-coating of a high surface energy material. Surface energy is a quantification of the disruption of intermolecular bonds when a surface is created. A high surface energy of a substrate enhances wetting of the ink. For the purposes of this specification, "ultranarrow" shall be considered 10 µm or less. A solvent in the ink causes swelling of the substrate to create a moat or embankment that confines the ink, thus preventing the ink of one line from merging with the ink of an adjacent line.

Accordingly, one inventive aspect of the present disclosure is a method of printing ultranarrow-gap lines of a functional material, such as an electrically conductive silver ink. The method entails providing a substrate having an interlayer coated on the substrate and printing the ultranarrow-gap lines by depositing ink on the interlayer of the substrate, the ink comprising the functional material and a solvent that swells the interlayer to cause the interlayer to bulge at edges of the ink to thereby define embankments that confine the ink.

This summary is provided to highlight certain significant inventive aspects but is not intended to be an exhaustive or limiting definition of all inventive aspects of the disclosure. Other inventive aspects may be disclosed in the detailed description and drawings.

BRIEF DESCRIPTION OF THE DRAWINGS

Further features and advantages of the present technology will become apparent from the following detailed description, taken in combination with the appended drawings, in which.

It will be noted that throughout the appended drawings, like features are identified by like reference numerals.

DETAILED DESCRIPTION

Disclosed herein is a method of printing ultranarrow-gap lines of a functional material. In general, the method entails providing a substrate having an interlayer coated on the substrate and printing the ultranarrow-gap lines by depositing ink on the interlayer of the substrate, the ink comprising the functional material and a solvent that swells the interlayer to cause the interlayer to bulge at edges of the ink to thereby define embankments that confine the ink. The ultranarrow-gap lines may be printed simultaneously. The ultranarrow-gap lines may be printed to define source and drain electrodes of a thin-film transistor of a printable electronic device. Using this method, it is possible to print ultranarrow-gap lines having a gap smaller than 10 μm, e.g. 3-4 μm. For a length of 1 mm, it is possible to print lines having a gap smaller than 3 μm, e.g. 1.5-3 μm. In various embodiments, the solvent may be ethanol, methanol, butanol, ethanediol, ethanol, glycerine, 2-isopropoxyethanol or any suitable combination thereof. In some embodiments, the interlayer is SU-8 being composed of a fully epoxidized bisphenol-A/formaldehyde novolac co-polymer. In other embodiments, the interlayer is polyvinylpyrrolidone (PVP). The functional material may be an electrically conductive ink such as, for example, a silver nanoparticle ink or any other equivalent ink. The substrate may be selected to be impermeable to the silver nanoparticle ink.

This method thus provides a high-resolution microfabrication patterning technique that employs a direct printing process that does not involve photolithography. Since the lack of control in inkjet printing is mostly due to uncontrolled spreading of the ink drops on substrates, the new method controls the interaction between the ink and substrate (or a pre-coated interlayer) to prevent, or at least substantially mitigate, that spreading. The formulated inks contain solvent which interacts with the substrate or pre-coated material and results in swelling on the edges of the printed patterns. The introduced pre-coated polymer layer (or substrate) is chosen to interact with the solvent of the ink in such a way that it swells predictably and controllably. The swelling of the polymer is especially pronounced at the edges of the printed drops and results in a microscopic moat preventing the ink from spreading. When two lines are printed beside each other, a natural strip or embankment is created which separates the two printed lines.

Figure 6:
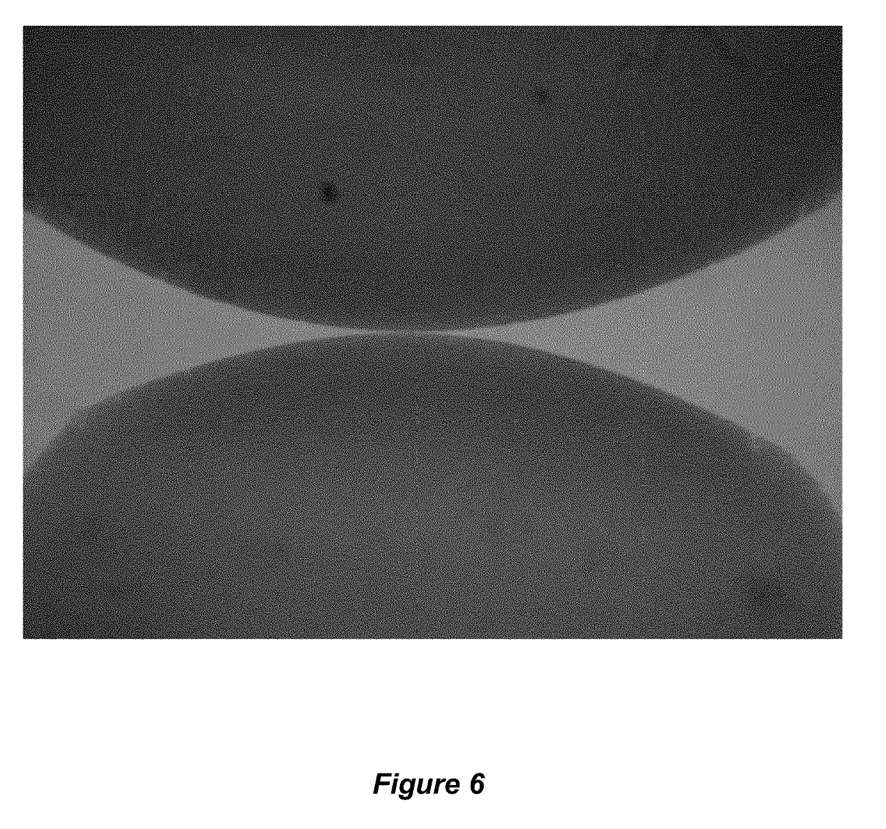
FIG. 6 depicts a formulated ink with ethanol printed on SU-8 with which a gap of around 0.3 μm was obtained using the present method.

Polymer materials exhibit different swelling ratios in the presence of different solvents. For example, PMMA, PVP, PDMS and SU-8 are sensitive to ethanol, methanol and butanol. Solvents cause swelling of the coated film, which is traditionally considered to be a drawback for the microfabrication process. In the present method, the ink-substrate swelling effect is used as an advantage to control the spreading of ink. By selecting suitable ink solvents and pre-coated materials (or substrate materials), it has been demonstrated that a small gap between printed drops (or lines) can be achieved by a direct printing process without resorting to any lithography process. PVP and SU-8 have been chosen for the example demonstrations because it is known that these materials swell under the selected solvents. When a large drop of ethanol interacts with either the PVP surface or the SU-8 surface, a significant swelling of the PVP and SU-8 occurs. When the DMP-3000 Model Fluid water-based ink is printed on SU-8 for a two-line pattern, it forms isolated large drops because the surface energy of SU-8 is too low and causes de-wetting of the pattern. Droplets for two printed lines will merge and form large drops. By adding 50% ethanol with DMP-3000, although the printed lines still de-wet on the SU-8 surface, a submicrometer gap of approximately 0.3 μm is obtained between the two drops as shown by way of example in FIG. 6.

Figure 7A:
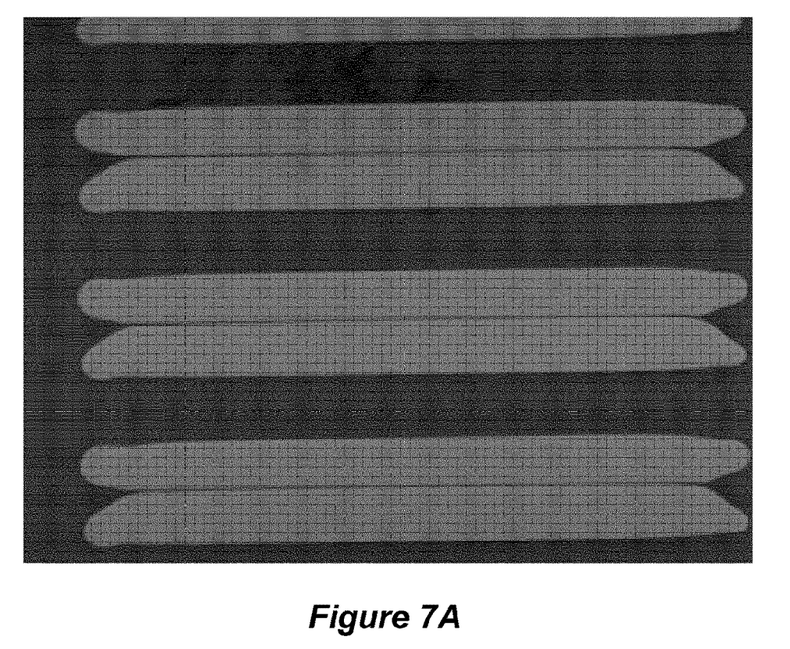
FIG. 7A depicts printed Ag lines with a channel length of 3 μm on SU-8 using the present method.
Figure 7B:
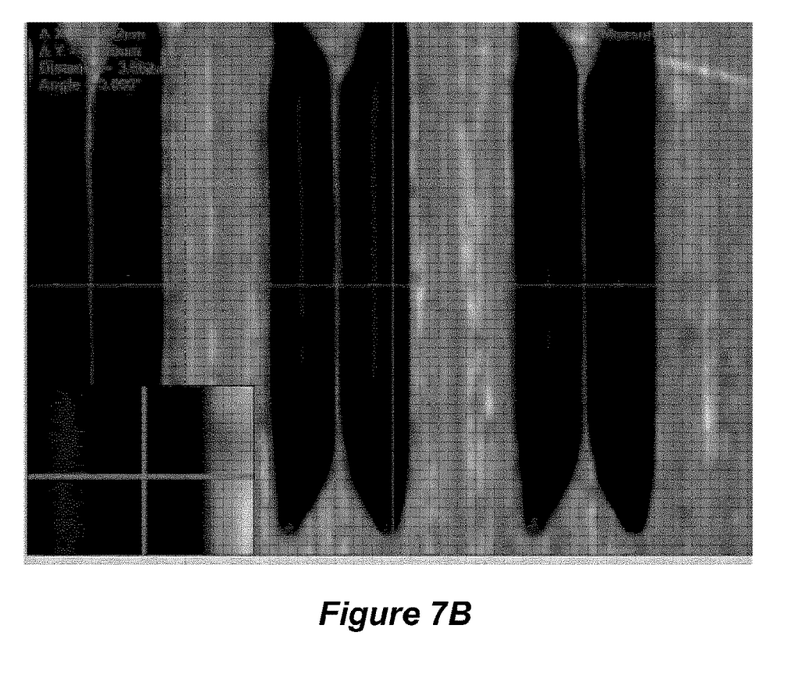
FIG. 7B depicts printed Ag lines with a channel length 4 μm on PVP using the present method.

Ultranarrow-gap lines can be printed using this method on different substrates. FIG. 7A depicts printed Ag lines with a channel length of 3 μm on SU-8. FIG. 7B depicts printed Ag lines with a channel length 4 μm on PVP. Although silver has been tested, it is predicted that other metal inks having the same or functionally equivalent solvents may be employed to achieve substantially similar results.

Figure 8A:
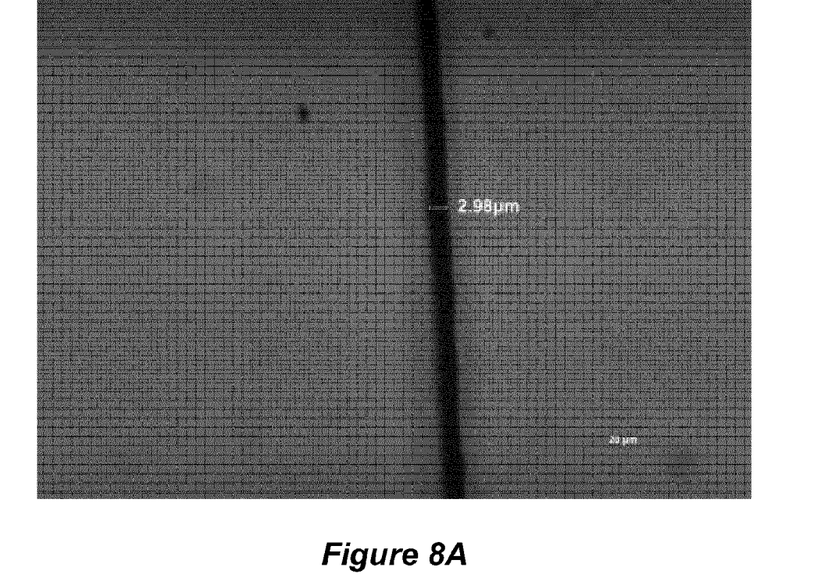
FIGS. 8A and 8B depict printed source and drain electrodes with gaps of 3 μm and 1.5 μm, respectively, for OFET fabrication (for which a directly printed uniform channel length over 1 mm has been achieved) using the present method.
Figure 8B:
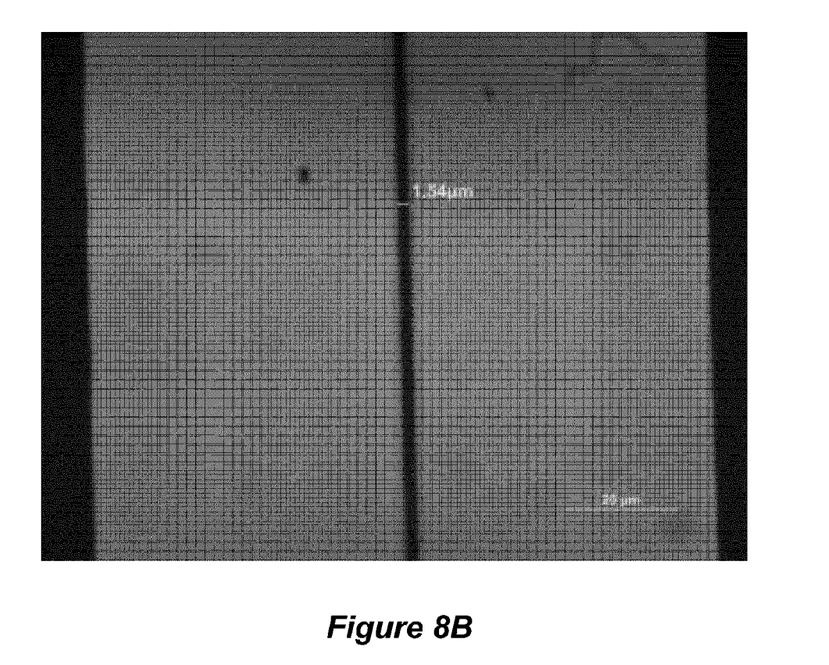
Figure 9:
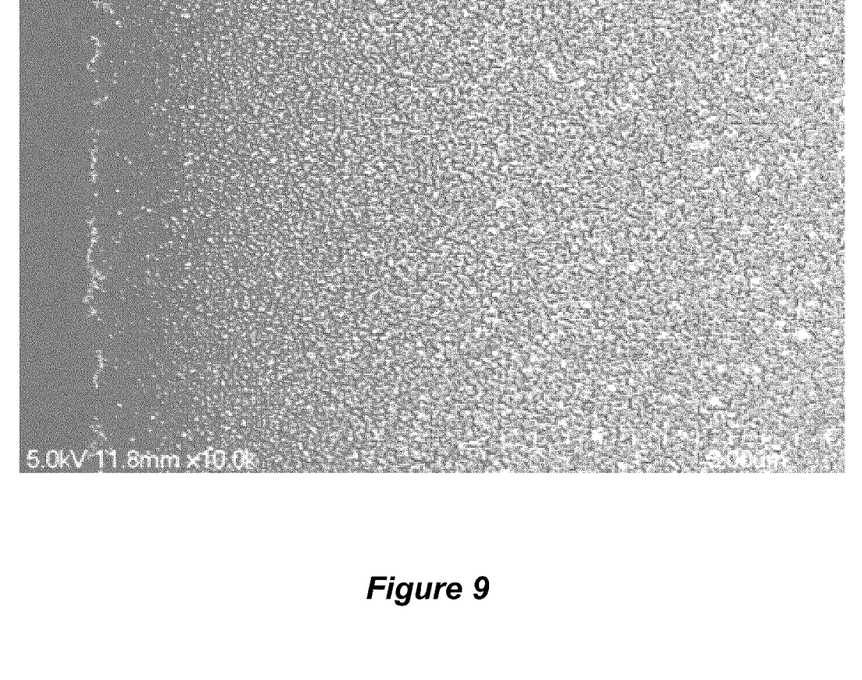
FIG. 9 is a scanning electronic microscope (SEM) image showing a very clear and sharp edge for the printed Ag conductor tracks.
Figure 10:
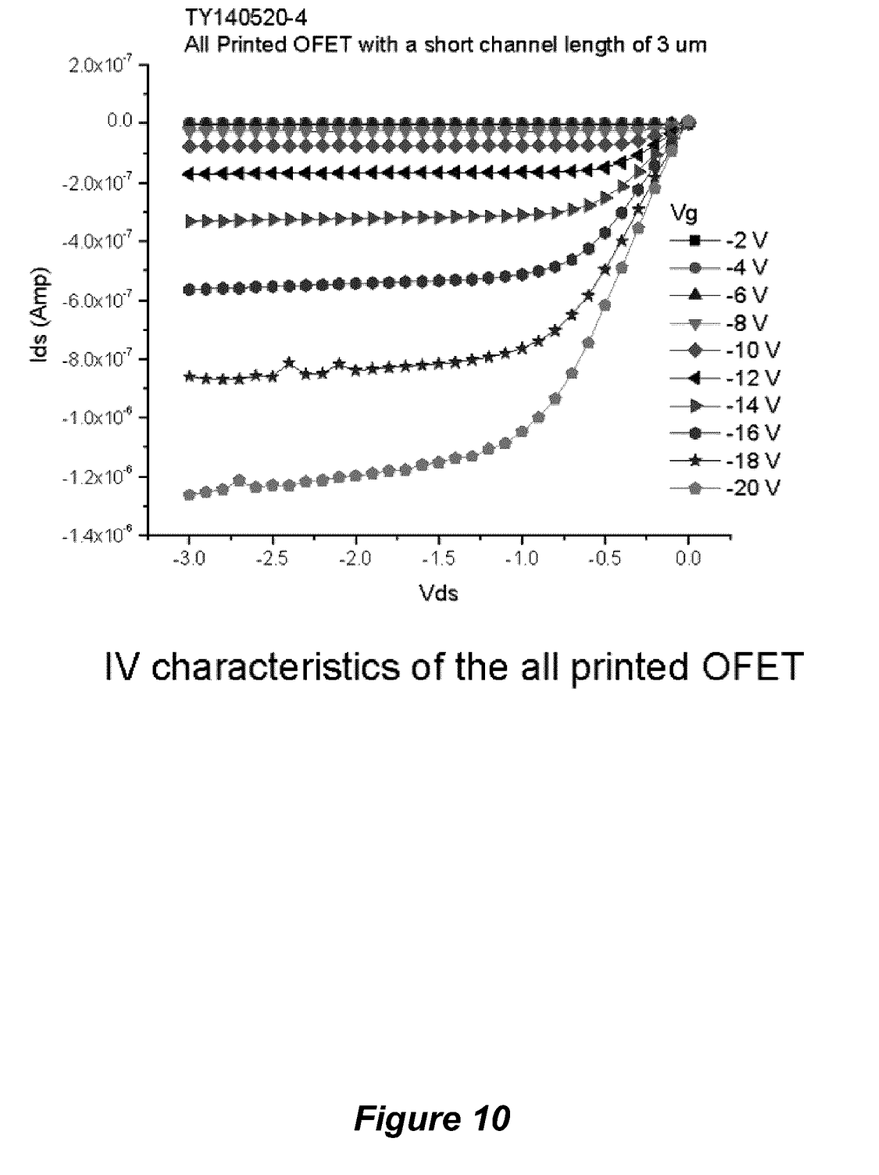
FIG. 10 is a graph plotting characteristics of an OFET printed using the present method.

The formulated silver ink has a much lower viscosity and thus it is difficult to obtain a reliable jettability for inkjet printing. Sunjet EMD 5603 Ag ink (which use ethanediol, ethanol, glycerine and 2-isopropoxyethanol solvents) was selected to be printed on SU-8 and PVP in this example. In this specific example, the substrate was subjected to a plasma pre-treatment prior to the printing process in order to increase the surface energy of the substrate to thereby provide the desired wetting condition. Inkjet-printed source and drain electrodes for thin-film transistor (TFT) fabrication with a channel length of 3 μm and 4 μm were obtained on SU-8 and PVP substrates, respectively, as shown in FIGS. 7A and 7B. As further illustrated in FIGS. 8A and 8B, two printed silver (Ag) lines of over 1 mm in length were printed with gaps of 3 μm and 1.5 μm between source and drain electrodes for an OFET without any electrical short occurring between the source and drain electrodes. The fact that such a narrow channel can be maintained over such a long distance demonstrates that the effect leads to very good control. FIG. 9 shows a scanning electron microscope (SEM) image of the printed Ag line. An all-printed organic transistor having a directly printed 3 μm channel length has been demonstrated as shown in FIG. 10 which presents as a graph the various current and voltage characteristics of a fully printed OFET made using this technique. This is an improvement by a factor of ten over state-of-the-art (conventional) inkjet printing. This method can be utilized for simple microfabrication patterning for different electronics applications, such as photomask patterning, printed sensors and transistors, etc.

Figure 11A:
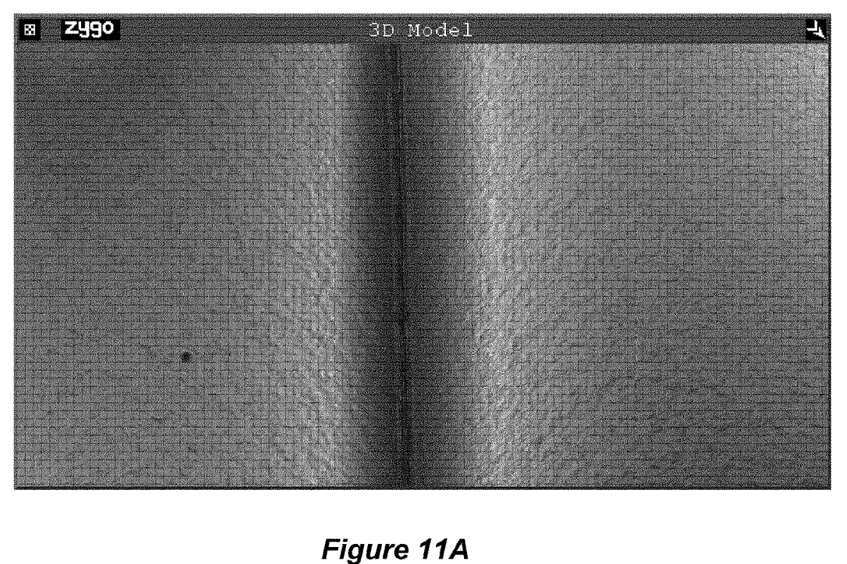
FIGS. 11A and 11B depict printed Ag lines with 3 μm gap analyzed by an optical profiler.
Figure 11B:
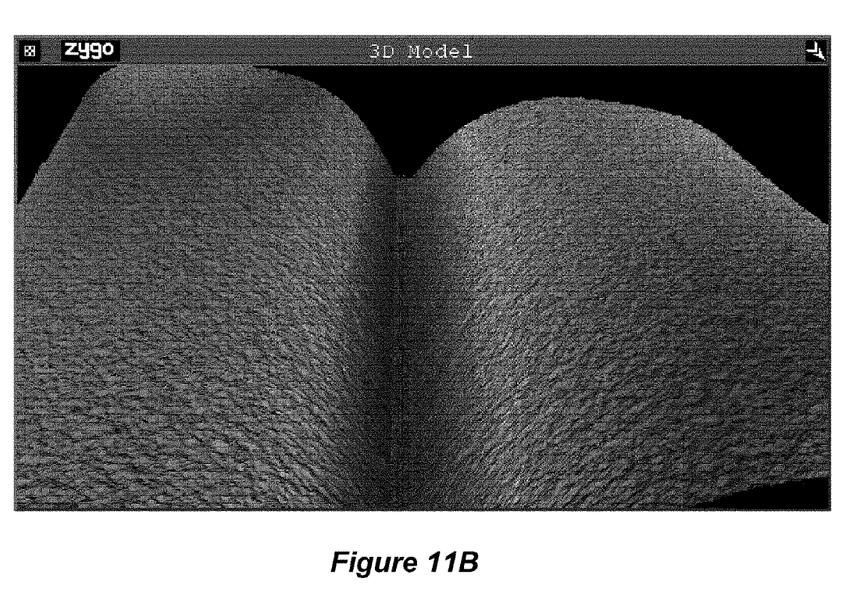
Figure 12A:
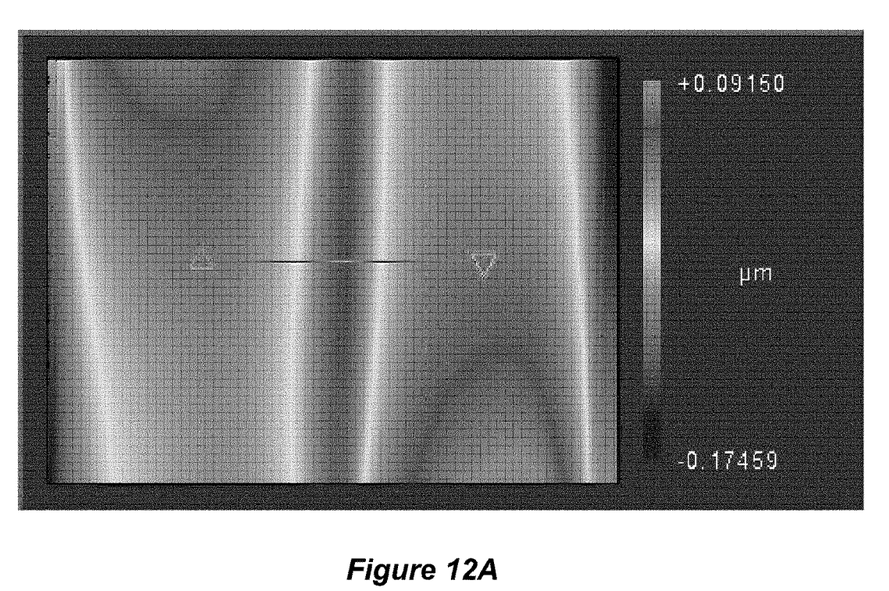
FIG. 12A depicts two printed lines which are separated (isolated) by the swollen SU-8 polymer.
Figure 12B:
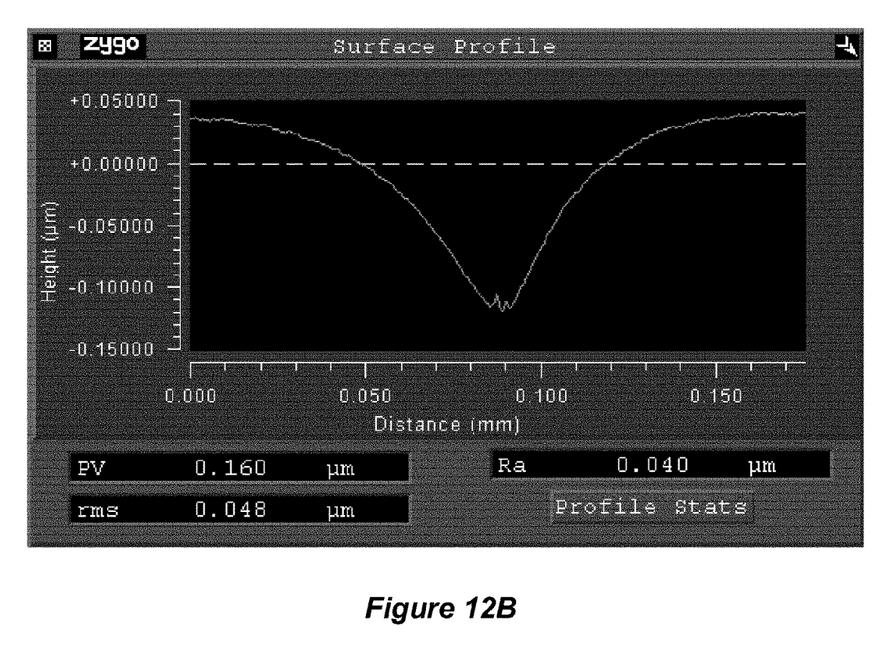
FIG. 12B depicts a data output interface of a surface profiler application showing numerical profile characteristics obtained using the present method.
Figure 13:
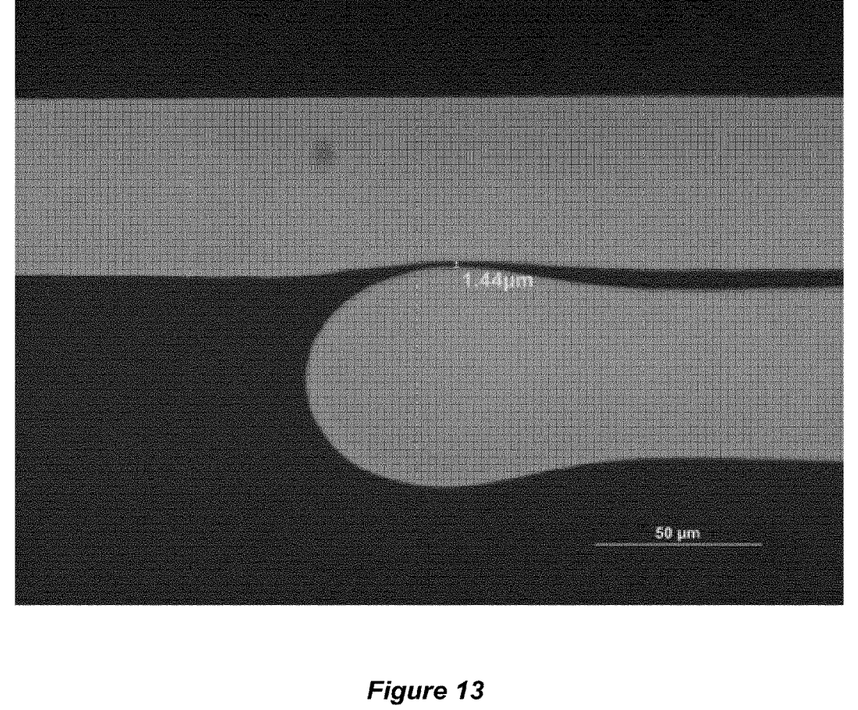
FIG. 13 depicts first and second printed lines in which the second line (on the upper side of the image) bends along the edge when the ink spreads because its displacement is limited by the swollen edge of the first printed line (on the bottom of the image)

FIGS. 11A and 11B show a three-dimensionally rendered optical profile of the electrode. As shown by the cross-section of the analysis in FIGS. 12A and 12B, two printed Ag lines were isolated by the swollen SU-8 polymer moat at the centre. FIG. 13 shows the swelling effect at the edge of the first printed line. The spreading of ink from the second printed line was limited by the swollen edge on the first printed line. Consequently, the two lines did not merge on the SU-8 substrate because of the swollen embankment or moat created by the solvent-substrate interaction.

Figure 14:
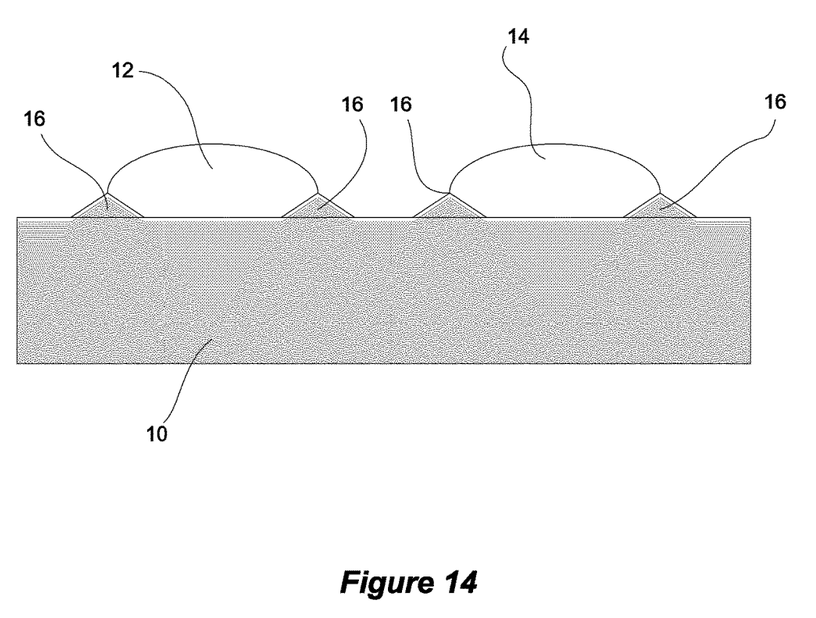
FIG. 14 schematically depicts the formation of ink-confining embankments which are formed by the swelling of the substrate caused by the ink-containing solvent.

FIG. 14 shows a substrate 10 upon which two adjacent lines of solvent-containing ink 12, 14 are deposited on the substrate. The solvent in the solvent-containing ink causes localized swelling of the substrate to form embankments 16 which confine the ink. In other words, the embankments constrain the ink to prevent the ink from spreading and merging with the ink from the adjacent line. Although the examples show two straight and parallel adjacent lines of ink, this concept may be applied to curved lines or to non-parallel lines or other patterns where an ultranarrow gap is desirable.

In contrast to known techniques, the present method does not use any lithographic method to attain high-resolution printing, nor does it require any pre-processing of the surface to prevent the spreading of ink droplets once they have reached the surface of the substrate. Rather, the present method uses a controlled interaction between the ink solvent and the layer upon which the ink is printed to prevent, or at least substantially inhibit, the unwanted spreading of the ink that would otherwise lead to merging of lines and thus a loss of resolution.

Using the present method, ultranarrow gap lines can be printed. It has been demonstrated that 3 μm and 1.5 μm channel gaps over a 1 mm length can be printed using a solvent-based Ag ink on a SU-8 polymer surface. By selecting the appropriate interaction between solvents and substrate (pre-coated polymer), a well-defined pattern can be obtained by this microfabrication printing process without resorting to lithography. This enables printing of high-performance transistors or other printable electronic devices without lithography and at a lower cost.

It is to be understood that the singular forms "a", "an" and "the" include plural referents unless the context clearly dictates otherwise. Thus, for example, reference to "a device" includes reference to one or more of such devices, i.e. that there is at least one device. The terms "comprising", "having", "including" and "containing" are to be construed as open-ended terms (i.e., meaning "including, but not limited to,") unless otherwise noted. All methods described herein can be performed in any suitable order unless otherwise indicated herein or otherwise clearly contradicted by context. The use of examples or exemplary language (e.g. "such as") is intended merely to better illustrate or describe embodiments of the invention and is not intended to limit the scope of the invention unless otherwise claimed.

The embodiments of the invention described above are intended to be exemplary only. As will be appreciated by those of ordinary skill in the art, to whom this specification is addressed, many obvious variations, modifications, and refinements can be made to the embodiments presented herein without departing from the inventive concept(s) disclosed herein. The scope of the exclusive right sought by the applicant(s) is therefore intended to be limited solely by the appended claims.

The invention claimed is:

1. A method of printing ultranarrow-gap lines of a functional material, the method comprising:
   providing a substrate having an interlayer coated on the substrate; and
   printing the ultranarrow-gap lines by depositing an ink on the interlayer of the substrate, the ink comprising the functional material and a solvent that swells the interlayer to cause the interlayer to bulge at edges of the ink to thereby define embankments that confine the ink.

2. The method of claim 1, wherein the solvent is ethanol.

3. The method of claim 1, wherein the solvent is methanol.

4. The method of claim 1, wherein the solvent is butanol.

5. The method of claim 1, wherein the solvent comprises ethanediol, ethanol, glycerine and 2-isopropoxyethanol.

6. The method of claim 1, wherein the interlayer is comprised of SU-8, which is composed of a fully epoxidized bisphenol-A/formaldehyde novolac co-polymer.

7. The method of claim 1, wherein the interlayer is comprised of polyvinylpyrrolidone (PVP).

8. The method of claim 1, wherein the ultranarrow-gap lines are printed simultaneously.

9. The method of claim 1, wherein the functional material is an electrically conductive ink.

10. The method of claim 9, wherein the electrically conductive ink is a silver nanoparticle ink.

11. The method of claim 10, wherein the substrate is impermeable to the silver nanoparticle ink.

12. The method of claim 1, wherein the ultranarrow-gap lines are printed to define source and drain electrodes of a thin-film transistor of a printable electronic device.

13. The method of claim 12, wherein a gap between the ultranarrow-gap lines is from 3 to 4 μm.

14. The method of claim 12, wherein a gap between the ultranarrow-gap lines is from 1.5 to 3 μm over a length of 1 mm.

15. The method of claim 12, wherein a gap between the ultranarrow-gap lines is smaller than 10 μm.

16. The method of claim 12, wherein a gap between the ultranarrow-gap lines is smaller than 3 μm over a length of 1 mm.

* * * * *